SWITCHING CIRCUIT UTILIZING BISTABLE SEMICONDUCTOR DEVICES

Filed June 11, 1964

INVENTOR
P. ZUK
BY
Sylvan Sherman
ATTORNEY 3,317,752
SWITCHING CIRCUIT UTILIZING BISTABLE SEMICONDUCTOR DEVICES Paul Zuk, Allentown, Pa., assignor to Bell Telephone Laboratories, Incorporated, New York, N.Y., a corporation of New York Filed June 11, 1964, Ser. No. 374,348
5 Claims. (Cl. 307—88.5)

This invention relates to electronic switching circuits and more specifically to circuits employing a plurality of series-connected bistable semiconductor devices.

In recent years, semiconductor devices have become increasingly popular for use in many switching applications including power supplies and modulators, among others. In the present state of the art, however, semiconductor devices have voltage and current handling capabilities which are somewhat limited in comparison with their older gas tube counterparts. Specifically, such devices have static voltage limitations which if exceeded will cause the device to break down. The term "static voltage" as used herein is understood to refer not only to direct current voltage, but also to alternating current voltages of relatively low frequency. Thus, in switching circuits where the applied voltage is or apt to be greater than the static breakdown voltage of a single device, it is necessary to utilize a plurality of these bistable semiconductor devices connected in a series arrangement.

Another serious limitation of most bistable semiconductor devices such as a silicon controlled rectifier arises because of their inherent interelectrode capacitances. Generally, the bistable semiconductor devices referred to have three electrodes, to be referred to hereinafter as the "cathode" electrode, the "anode" electrode and the "gate" electrode. Due to the anode-to-gate electrode capacitances, these devices are subject to premature or unwanted "turn-on," induced by rapid variations or transients in the voltage appearing across the device. This unwanted turn-on, commonly referred to as "dynamic breakdown," occurs even when the static voltage limitations of such devices are not exceeded.

Accordingly, it is an object of the present invention to minimize static and dynamic breakdown effects in electronic switches utilizing bistable semiconductor devices.

Previously, attempts have been made to resist the effects of dynamic breakdown in bistable semiconductor devices by applying a reverse-biasing potential between their gate and cathode electrodes. (See, for example, the copending application of G. W. Wells case 5, Ser. No. 223,160, filed Sept. 12, 1962.) The reverse-biasing technique shown specifically in the Wells application is, however, operable only when a single bistable semiconductor device is used or when the gate electrodes of a plurality of devices are operated at the same potential. To achieve reverse-biasing presents a problem, however, when such devices are operated in series. This problem occurs because of the fact that the gate electrode of each device of the series string must be biased negatively relative to its corresponding cathode. But in circuits utilizing a series string of bistable semiconductor devices, the cathode of each device of the string is at a potential different than that of the cathodes of the other devices of the string. It follows then that the gate electrodes must also be at different potentials and should be, in effect, isolated from one another for biasing purposes.

Two other methods of reverse-biasing series-connected bistable semiconductor devices are taught by T. Hamburger et al. in an article entitled, "How to Get More Power From SCR Radar Modulators," in Electronic Design, Sept. 13, 1963, pp. 46–51. One of the structures of Hamburger et al. utilizes gate electrodes which are isolated by means of individual pulse transformers. The other structure of this article also utilizes pulse transformers for isolation and, in addition, requires repetitive gating pulses. As these structures are extended to trigger more than a very few bistable semiconductor devices in series, the design of the transformers becomes very difficult. In addition, the over-all performance of the switch is degraded due to the stray capacitance between the secondary windings and between the secondary and primary windings of the transformers. These stray capacitances, in combination with other stray capacitances, cause undesirable non-uniform voltage division across the series-connected devices during periods of dynamic voltage change.

It is, therefore, another object of the present invention to simplify means for limiting dynamic breakdown in electronic switches utilizing series-connected bistable semiconductor devices.

In accordance with the present invention these objects are accomplished by connecting a plurality of serially-connected bistable semiconductor devices in series with a power source and output load circuit. A voltage divider network is connected in parallel with the semi-conductor devices between the cathode of the first device and the anode of the last device of the series string. The remaining cathodes and anodes of the devices of the series string are connected to appropriate potential points along the voltage divider network. Negative biasing of the gate electrodes of the semiconductor devices is provided by connecting the gate electrodes of all but the first device to the voltage divider network at potential points less than the potentials of their respective cathodes.

The circuit is switched "on" by means of a triggering pulse applied to the gate electrode of the first device of the series string. Capacitance elements, connected across portions of the voltage divider, discharge when their associated semiconductor device switches "on" thus providing gating current for the next succeeding device of the series string.

The above-mentioned and other features and objects of this invention will become more apparent by reference to the following description taken in conjunction with the accompanying drawing in which.

Figure 1:
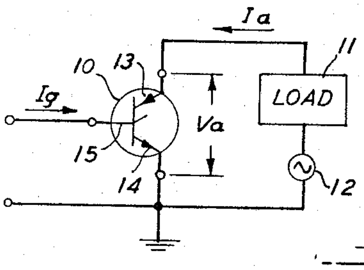
FIG. 1 PRIOR ART
FIG. 1 is a schematic illustration of a simplified electronic switch according to the prior art utilizing a single bistable semiconductor device.

Referring more particularly to the drawing, FIG. 1 is a schematic diagram of an electronic switch well known in the art. In this circuit, an active bistable semiconductor switching device 10 is connected in series with a load 11 and a power supply 12, the latter being shown in FIG. 1 as a simple A.C. voltage source. Bistable device 10 can comprise an avalanche transistor, a pnpn transistor such as a silicon controlled rectifier, or any other device having the characteristics to be described in greater detail hereinbelow. Because of the many advantages enjoyed by pnpn transistors, however, they have come to be widely utilized in switching circuits and, therefore, the various embodiments of the present invention will be illustrated using such devices as the active elements.

Various semiconductor devices of the type utilized for switching purposes and having similar characteristics, have been designated and described by many systems of nomenclature. In view of this fact, the devices described herein will be referred to simply as bistable semiconductor devices although it is understood that the scope of the present invention is not intended to be limited by this choice of terminology. For the same reason the several electrodes of these devices are referred to herein as the cathode electrode, the anode electrode and the gate electrode, after the more familiar terminology of the voltage-operated thyratron gas tube.

Returning to the circuit of FIG. 1, bistable semiconductor device 10 is normally in the "off" or "nonconducting" state. That is, the path between anode 13 and cathode 14 presents a very high resistance to the anode current $I_a$. Upon application of a gating or triggering current $I_g$ to the gate electrode 15 of device 10, at a time when anode 13 is positive with respect to cathode 14, the device "turns on" regeneratively. This regenerative turn-on occurs because the current amplification factor of the bistable semiconductor device is an increasing function of the gating current $I_g$. At a relatively low value of $I_g$, the amplification factor becomes greater than unity and regeneration takes place. When this occurs the anode current $I_a$ through the device is, for practical purposes, limited only by the external circuitry.

One drawback of the simple switch of FIG. 1, mentioned above, resides in the fact that the anode-cathode voltage $V_a$ of bistable semiconductor device 10 cannot exceed a certain maximum value or the device will break down and conduct, even the absence of a gating current $I_g$. Appropriately, this maximum voltage is generally referred to as the static breakdown voltage of the device. Commercially available bistable semiconductor devices now have breakdown voltage ratings of several hundred volts. It follows, therefore, that if higher voltages are to be encountered, the circuit of FIG. 1 cannot be utilized, or at least without extensive modification.

Another serious disadvantage of the circuit of FIG. 1, also mentioned above, arises because of the inherent interelectrode capacitance of device 10. Due to this capacitance, such devices are subject to premature or unwanted breakdown induced by rapid variations or transients in the anode-cathode voltage. This undesirable dynamic breakdown occurs even when the static anode-cathode voltage is considerably less than the static breakdown voltage of the device.

Figure 2:
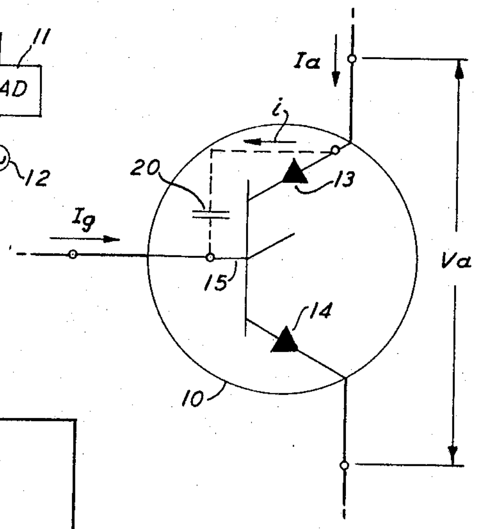
FIG. 2 PRIOR ART
FIG. 2 is a schematic representation of the semiconductor device of FIG. 1 useful in th explanation of the dynamic breakdown effect.

A simple, although theoretically incomplete explanation of the dynamic breakdown effect can be made with reference to FIG. 2, which is a schematic reproduction of bistable semiconductor device 10 of FIG. 1. Like numerals have been carried over from that circuit to indicate the anode 13, cathode 14, and gate electrode 15. A capacitor 20 is shown connected by dashed lines between anode 13 and gate electrode 15. Capacitor 20 represents the internal capacitance between these two electrodes inherent in the structure of device 10.

When bistable semiconductor device 10 is in its "off" condition and the anode-cathode voltage, $V_a$, is constant, substantially no current flows between anode 13 and gate electrode 15. However, if voltage $V_a$ rises very rapidly, or if a voltage transient appears superimposed on the anode-cathode voltage, $V_a$, then an internal capacitance charging current, *i*, will flow through capacitor 20 to gate electrode 15. If the magnitude and duration of this current is great enough, it will supply enough gating current to switch device 10 from its "off" to its "on" condition. Furthermore, since the current through a capacitor is given by the expression $i=Cdv/dt$, it is apparent that the internal capacitance charging current, *i*, is dependent upon the rate of change of the anode-cathode voltage. In other words, a slowly changing anode-cathode voltage produces very little internal capacitance charging current, whereas a rapidly changing anode-cathode voltage produces a much greater current which can, in fact, be sufficiently high to cause device 10 to break down prematurely.

Figure 3:
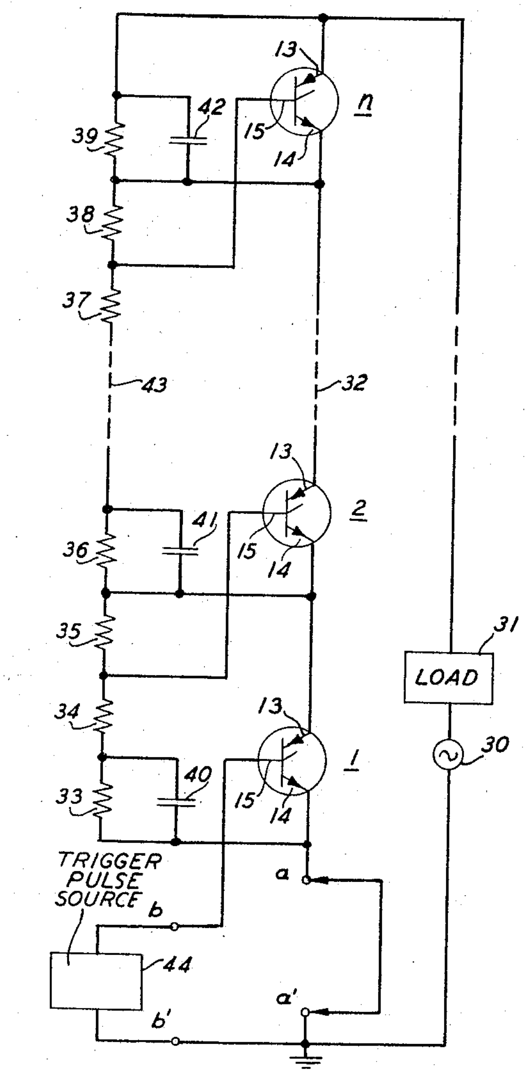
FIG. 3 is a schematic diagram of a preferred embodiment of the present invention.

In FIG. 3 there is shown a schematic diagram of a preferred embodiment of the present invention which minimizes the adverse effects of dynamic breakdown while simultaneously preventing static breakdown. In the circuit of FIG. 3 there is shown a series string comprising a plurality of bistable semiconductor devices 1, 2 . . . *n* connected in series with a power supply 30 and a load 31. Again the power supply is shown, for the sake of simplicity, as a conventional A.C. voltage source. The series string is formed by connecting cathode 14 of device 1 through terminals *a–a'* to one terminal of power supply 30; connecting anode 13 of device 1 to cathode 14 of device 2; and so on until the anode of the next to last device is connected to cathode 14 of device *n*. Finally, the anode of device *n* is connected through load 31 to the other terminal of power supply 30.

In the circuit of FIG. 3, dashed line 32 represents the presence of possible intervening stages between bistable semiconductor device 2 and *n*. It is understood that the number of devices utilized is generally determined by the magnitude of the power supply voltage and can include from two to 100 or more devices.

In the embodiment of FIG. 3, terminals *a–a'* in series with the cathode of bistable semiconductor are short circuited. Modifications of this circuit can be made by substituting the elements shown in FIG. 4 or FIG. 5 in place of the short circuit. The purpose of these substitutions will be explained in greater detail hereinbelow.

Also connected between cathode 14 of device 1 and anode 13 of device *n* in shunt with the power supply 30 and load 31 is a voltage divider network comprising a plurality of resistors, 33, 34, 35, 36 . . . 37, 38 and 39 and capacitors 40, 41 and 42. In general three resistors and one capacitor are associated with each of the bistable semiconductor devices, except for device 1. For example, resistors 34, 35 and 36 and capacitor 41 can be considered as associated with device 2 and resistors 37, 38 and 39 and capacitor 42 as associated with device *n*. In the embodiment of FIG. 3 bistable semiconductor device 1 has only one resistor 33 and one capacitor 40 associated with it. The connection of bistable semiconductor device 1, 2 . . . *n* to the voltage divider network can be best explained in terms of the operation of the embodiment.

In operation, a voltage derived from power supply 30 is applied, through load 31, between anode 13 of bistable semiconductor device *n* and cathode 14 of device 1. Assuming that the applied voltage is positive at the anode of device *n* (that is, the power supply is in its positive half-cycle) the junctions formed by the interconnection of the various resistors and capacitors of the above-mentioned voltage divider network are also at positive potentials with respect to cathode 14 of device 1. Hereinafter, unless otherwise indicated, any reference to the potentials at various circuit points will refer to the potentials at a time during which power supply 30 is in its positive half-cycle. Moreover, it will be assumed that the bistable devices are poled so that conduction therethrough can occur only in the positive half-cycle, the devices being non-conductive during the negative half-cycle. In the embodiment of FIG. 3, of course, cathode 14 of device 1; terminals *a*, *a'*, and *b'*; and one terminal of power supply 30 are all connected together and are at ground potential, and thus, at a negative potential with respect to other points in the circuit.

Initially, each of the bistable semiconductor devices 1, 2 . . . *n* is in its "off" state. The anodes 13 of devices 1, 2 . . . *n* are connected to junctions on the voltage divider network having progressively higher potentials from device 1 through device *n*. The cathodes 14 of devices 1, 2 . . . *n* are connected to junctions on the voltage divider network also having progressively higher potentials from device 1 through *n*. The cathode of each device, however, is at a lower potential point than the anode of the respective device. The gate electrodes of devices 2 . . . *n* are connected to junctions on the voltage divider network of progressively higher potential from device 2 through device *n*. The potential on each gate electrode, however, is lower than the potential on the cathode of the respective device.

More specifically, in the embodiment of FIG. 3, gate electrode 15 of device 2 is connected to the junction between resistors 34 and 35. Cathode 14 of device 2 is connected to the junction between resistances 35 and 36, it being the next higher potential point on the voltage divider. The intervening bistable semiconductor devices, if any, are connected in a like manner to the intervening resistances between resistors 36 and 37. The position of possible intervening resistors is indicated by dashed line 43. Finally, gate electrode 15 of device *n* is connected to the junction between resistors 37 and 38 and the cathode of this device is connected to the junction between resistors 38 and 39. Input terminals *b* and *b'* are provided between gate electrode 15 of bistable semiconductor device 1 and the ground terminal of power supply 30.

Returning to the description of the operation of this embodiment, by means of the voltage divider network comprising resistors 33–39 and capacitors 40–42, the applied voltage is distributed so that the cathode-to-anode voltage of any single device is less than its static breakdown voltage. This static voltage division is accomplished by ordinary resistance-network design techniques. The values of resistors 33–39 depend upon the applied power supply voltage and the characteristics of devices 1, 2 . . . *n*, as will be explained in greater detail hereinbelow.

Dynamic breakdown is prevented by reverse-biasing the gate electrodes 15 of each bistable semiconductor device. This is accomplished in the present embodiment by the above-mentioned connection of the gate electrode of each device 2 . . . *n* of the series string to a lower potential point on the voltage divider network than the corresponding cathode of the device. Any voltage having a fast rise time, such as a transient, appearing across the series-connected bistable semiconductor devices also appears across the voltage divider network. Due to the presence of capacitors 40, 41 and 42 in the voltage divider network, such voltage transient, to a large degree, bypasses each of the bistable semiconductor devices. Additionally, the current produced by the voltage transient through capacitors 40, 41 and 42 flows through resistors 35 and 38. This current thereby produces an instantaneous increase in the reverse-biasing potential at gate electrodes 15 of devices 2 through *n*. Due to this high negative potential at gate electrode 15, the internal capacitance charging current, referred to above, is shunted away from the gate electrode-to-cathode junction of the devices. Thus, the capacitance charging current which would otherwise cause dynamic breakdown is shunted out of the bistable semiconductor devices and into the voltage divider network.

The gate electrode of bistable semiconductor device 1, as mentioned above, connects to input terminal *b*. Negative biasing to this device can be supplied through terminal *b* from an external triggering circuit depicted by block 44. Alternatively, gate electrode 15 of device 1 can be self-biased by substituting for the short circuit across terminals *a–a'* the branch circuit of either FIG. 4 or FIG. 5.

In order to switch the series string into its "on" state, a positive going trigger pulse is applied to input trigger terminals *b–b'*. This pulse can be provided by any trigger circuit well known in the art and capable of supplying the gating current required by bistable semiconductor device 1. Many trigger circuits which can be adapted for this purpose are disclosed in chapter 4 of the "Silicon Controlled Rectifier Manual," 2nd edition, General Electric Co., 1961, pp. 31–65. The trigger pulse applied to terminal *b* causes device 1 to switch into its "on" state thereby placing its anode and, therefore, cathode 14 of device 2, at substantially ground potential.

Capacitor 40, before the trigger pulse was applied, had developed a stored charge by virtue of the static voltage drop across resistor 33. When bistable semiconductor device 1 is switched "on" this capacitor discharges through resistor 34 thereby causing a positive potential to appear on gate electrode 15 of device 2. The external discharge current from capacitor 40 continues by flowing through gate electrode 15 of device 2 causing it to switch into its "on" state. When device 2 switches "on" it, in turn, causes the next device of the series string to switch "on" and so on until device *n* is also in its high-conductance state.

Due to the bistable nature of devices 1, 2 . . . *n*, once they are in the "on" state they remain so as long as a sufficient anode holding current flows through them. When the anode current is reduced to zero, they again revert to their normal "off" condition. If power supply 30 provides alternating current, as in the ordinary case, devices 1, 2 . . . *n* will revert to their nonconducting state at least when the positive half-cycle of the A.C. power supply current is completed.

In some instances it is feasible to employ the internal resistance between particular pairs of electrodes of the bistable devices as resistors of the voltage divider network. Specifically it is possible to eliminate the resistors connected in parallel across the cathode and gate electrodes and to utilize the cathode-to-gate internal resistance of the bistable device. In such an instance one foregoes some protection against reverse-static breakdown.

One embodiment of this kind was constructed utilizing three bistable semiconductor devices. This embodiment was designed for a supplied voltage of approximately 700 volts R.M.S. The functions of resistors 33, 36 and 39 are primarily to distribute the static supply voltage among bistable semiconductor devices 1, 2 . . . *n*, so that the static breakdown potential of none of these devices is exceeded. Accordingly, resistors 33, 36, and 39 can be referred to as the "static voltage dividing resistors." In the experimental embodiment, a value of 220,000 ohms was selected for these static voltage dividing resistors.

The primary function of resistors 35 and 38 is to limit the maximum voltage between the cathodes 14 and gate electrodes 15 of the bistable semiconductor devices to which they are connected, during the negative half of the power supply cycle. Thus, these resistors are termed the "cathode limiting resistors." Depending upon the characteristics of the particular devices utilized, static reverse breakdown can occur between these electrodes and cause damage to the devices. In the described embodiment the characteristics of the bistable semiconductor devices were such that this reverse breakdown was not a factor. Accordingly, cathode limiting resistors 35 and 38 were open-circulated. The function of resistors 35 and 38, in this case is served by the finite cathode-to-gate electrode resistance of the bistable semiconductors. Where such reverse breakdown is a factor, however, finite cathode limiting resistors of relatively low value can be provided to limit the voltage between the cathode and gate electrodes of the bistable semiconductor devices.

Capacitors 40, 41 and 42 serve a dual function. First, they distribute any dynamic or transient voltage occurring in the power supply circuit through the voltage divider network thereby partially shunting this voltage around the anode-to-cathode terminals of the bistable semiconductor devices. Secondly, they provide the triggering current which is utilized to switch the next higher device of the series string. For these reasons capacitors 40, 41 and 42 preferably have a value at least 10 or more times the value of the anode-to-gate electrode capacitance mentioned in connection with FIG. 2. In the experimental embodiment, a value of 0.0011 microfarad was chosen for capacitors 40, 41 and 42.

Resistors 34 and 37 serve to limit the value of the triggering current to the gate electrodes of the bistable semiconductor devices when the capacitor associated with the next preceding device begins to discharge. Thus, resistors 34 and 37 are termed the "gate current-limiting resistors." Their values are dependent upon the charge stored in capacitors 40, 41 and 42 and the gating current required to turn the bistable semiconductor devices "on." In the one embodiment gate current-limiting resistors 34 and 37 were 100 ohms.

Figure 4:
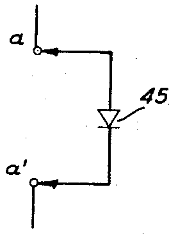
FIG. 4 is a schematic diagram of a portion of the embodiment of FIG. 3 showing a possible modification of that embodiment.
Figure 5:
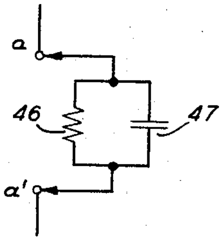
FIG. 5 is a schematic diagram of a portion of the embodiment of FIG. 3 showing another possible modification of that embodiment.

As mentioned above, the branch circuits of FIG. 4 or FIG. 5 can be substituted in place of the short circuit across terminals *a* and *a'* of the switch of FIG. 3. FIG. 4 is a schematic diagram of that portion of FIG. 3 showing terminals *a–a'* connected by a diode 45. FIG. 5 is a similar schematic diagram showing the parallel combination of a resistor 46 and capacitor 47 connecting terminals *a–a'*. When either of these circuits is substituted in the embodiment of FIG. 3, the operation of that embodiment is substantially the same as described above. The effects of the substitution of the elements of FIG. 4 and FIG. 5 is to self-bias the gate electrode 15 of bistable semiconductor device 1 by raising the cathode potential of that device to a value above zero. This obviates the necessity of providing a static reverse-biasing potential to the gate electrode of bistable semiconductor device 1 by means of the trigger pulse source.

In all cases it is understood that the above-described arrangements are illustrative of a small number of the many possible specific embodiments which can represent applications of the principles of the present invention. Numerous and varied other arrangements can be readily devised in accordance with these principles by those skilled in the art without departing from the spirit and scope of the invention.

What is claimed is:

1. An electronic switch comprising, in combination:
a plurality of bistable semiconductor devices, each of said devices having an anode, a cathode and a gate electrode,
means for connecting the anode of each device to the cathode of the next succeeding device,
means for connecting a voltage source and utilization means between the cathode of a first of said devices and the anode of a last of said devices,
a voltage divider network connected between said cathode of said first device and said anode of said last device,
means for connecting the cathodes of the remaining devices between said first and said last device to progressively higher potential points along said voltage divider network,
means for connecting the gate electrode of said last and said remaining devices to potential points along said voltage divider network lower than the respective potentials of their corresponding cathodes,
means for reverse-biasing said first device,
means for applying trigger pulses to the gate electrode of said first device, and
capacitance means shunting elements of said voltage divider network, said capacitance means adapted for providing triggering current to said gate electrodes of said remaining and last devices in response to said trigger pulses.

2. In combination:
a circuit comprising a serially-connected load and voltage source,
means for connecting a switch in said circuit for interrupting the current therein,
said switch comprising a plurality of bistable semiconductor devices, each device having an anode, a cathode and a gate electrode,
a voltage divider network connected between the cathode of a first of said devices and the anode of a last of said devices,
means for serially connecting the remaining devices between the anode of said first device and the cathode of said last device,
means for connecting the junctions formed by the interconnection of the cathodes and anodes of said serially-connected devices to said voltage divider network.
means for connecting the gate electrodes of said last and said remaining devices to said voltage divider network at potentials lower than the respective potentials of their corresponding cathodes,
means for reverse-biasing said first device,
means for applying trigger pulses to the gate electrode of said first device, and
capacitance means shunting elements of said voltage divider network, said capacitance means adapted for providing triggering current to said gate electrodes of said remaining and last devices in response to said triggering pulses, and for shunting voltage transients away from said bistable semiconducting devices to said voltage divider network.

3. An electronic switch comprising, in combination:
a plurality of bistable semiconductor devices, each of said devices having a cathode, an anode and a gate electrode,
circuit means for connecting a voltage source and load between the cathode of a first device and the anode of a last device,
means for connecting the remaining devices in a series string between the anode of said first device and the cathode of said last device,
the series combination of a static voltage dividing resistor, a gate current-limiting resistor and a cathode limiting resistor connected between the cathode of said first and remaining devices and the cathode of the next succeeding device of said series string,
means for connecting the gate electrodes of said next succeeding devices to the junction formed by the connection of said static voltage dividing resistor and gate current-limiting resistor,
a further static voltage dividing resistor connected between said cathode and anode of said last device,
means for shunting each of said static voltage divider resistors with a capacitance element, and
means for connecting a trigger pulse source to the gate electrode of said first device.

4. The combination according to claim 3 wherein said first circuit includes a voltage breakdown device between said voltage source and said cathode of said first device.

5. The combination according to claim 3 wherein said circuit means includes the parallel combination of a resistor and capacitor between said voltage source and said cathode of said first device.

References Cited by the Examiner

UNITED STATES PATENTS 3,100,268 8/1963 Foote .............. 307—88.5

DAVID J. GALVIN, *Primary Examiner.*

J. BUSCH, *Assistant Examiner.*